United States Patent
DeOrnellas et al.

(10) Patent No.: US 7,223,699 B2
(45) Date of Patent: ***May 29, 2007

(54) PLASMA ETCH REACTOR AND METHOD

(75) Inventors: Stephen P. DeOrnellas, Santa Rosa, CA (US); Leslie G. Jerde, Novato, CA (US); Alferd Cofer, Petaluma, CA (US); Robert C Vail, Windsor, CA (US); Kurt A. Olson, Sebastopol, CA (US)

(73) Assignee: Tegal Corporation, Petaluma, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/087,540

(22) Filed: Mar. 23, 2005

(65) Prior Publication Data

US 2005/0164513 A1  Jul. 28, 2005

Related U.S. Application Data

(60) Continuation of application No. 10/156,478, filed on May 28, 2002, now Pat. No. 6,905,969, which is a division of application No. 08/675,559, filed on Jul. 3, 1996, now Pat. No. 6,500,314.

(51) Int. Cl.
*H01L 21/302* (2006.01)

(52) U.S. Cl. .............. 438/706; 438/710; 438/714; 156/345.3

(58) Field of Classification Search .......... 438/706, 438/710, 712, 714, 720; 156/345.3, 34
See application file for complete search history.

(56) References Cited

U.S. PATENT DOCUMENTS

| 5,453,305 | A | * | 9/1995 | Lee ........................ 427/562 |
| 5,707,486 | A | * | 1/1998 | Collins ............... 156/345.38 |
| 6,048,798 | A | * | 4/2000 | Gadgil et al. ............. 438/714 |
| 6,620,335 | B1 | * | 9/2003 | DeOrnellas et al. .......... 216/71 |

* cited by examiner

*Primary Examiner*—Lan Vinh
(74) *Attorney, Agent, or Firm*—Fliesler Meyer LLP

(57) ABSTRACT

A plasma etch reactor 20 includes a upper electrode 24, a lower electrode 24, a peripheral ring electrode 26 disposed therebetween. The upper electrode 24 is grounded, the peripheral electrode 26 is powered by a high frequency AC power supply, while the lower electrode 28 is powered by a low frequency AC power supply, as well as a DC power supply. The reactor chamber 22 is configured with a solid source 50 of gaseous species and a protruding baffle 40. A nozzle 36 provides a jet stream of process gases in order to ensure uniformity of the process gases at the surface of a semiconductor wafer 48. The configuration of the plasma etch reactor 20 enhances the range of densities for the plasma in the reactor 20, which range can be selected by adjusting more of the power supplies 30, 32.

20 Claims, 10 Drawing Sheets

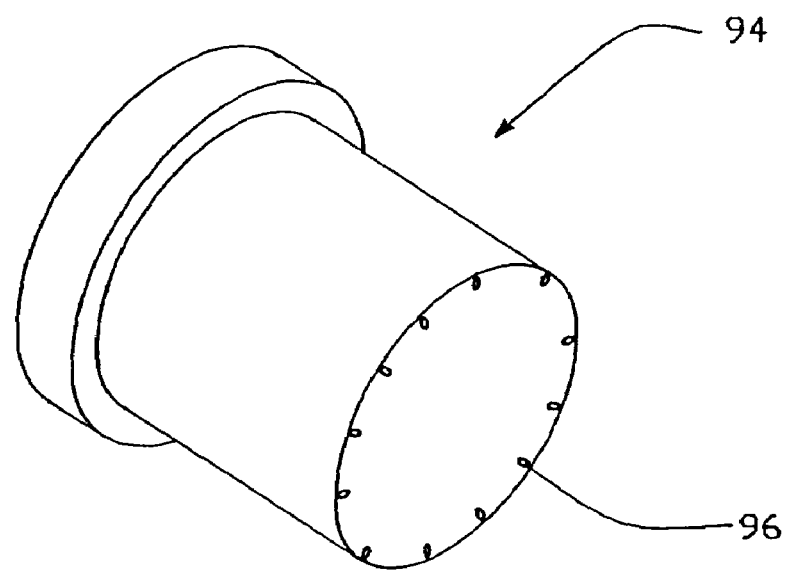
FIG.—4a
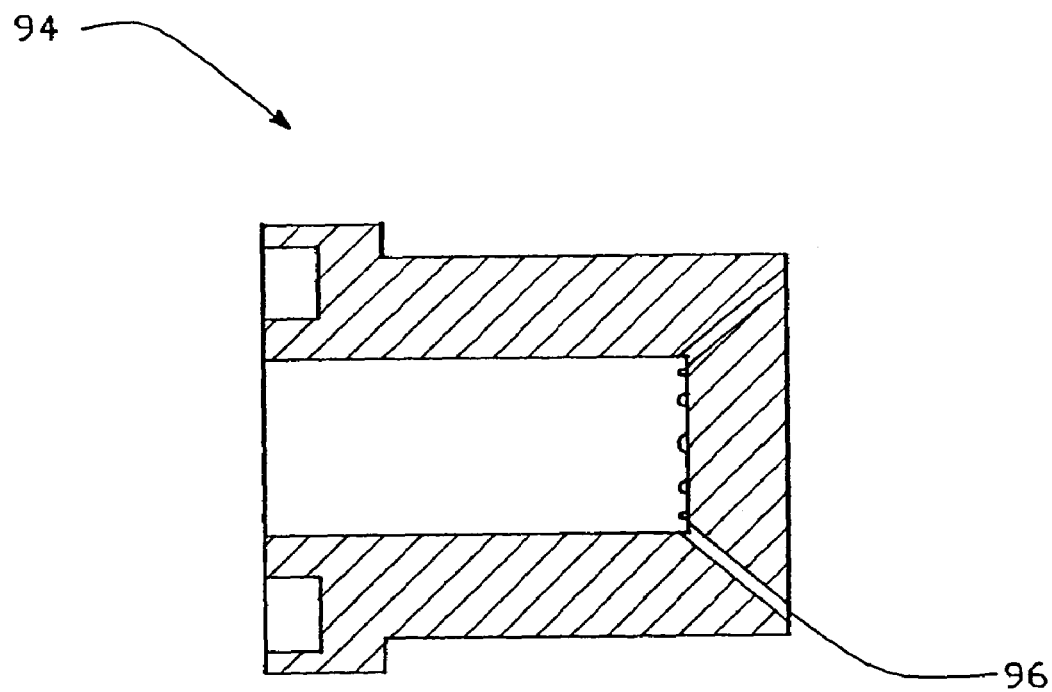
FIG.—4b

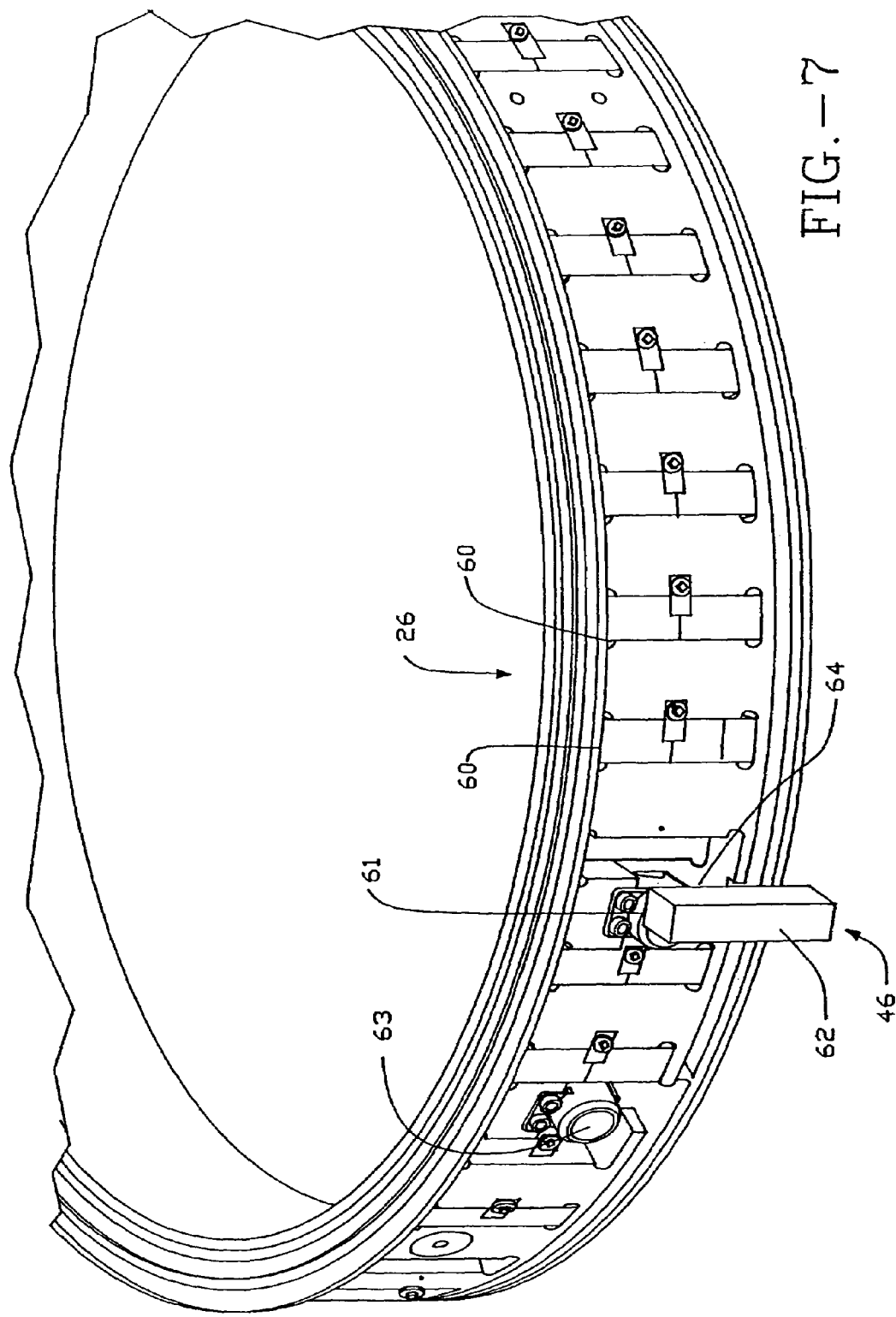
FIG.—7

PLASMA ETCH REACTOR AND METHOD

CLAIM TO PRIORITY

This application is a continuation application of U.S. patent application Ser. No. 10/156,478, filed May 28, 2002 now U.S. Pat. No. 6,905,969, which is a divisional application of U.S. patent application Ser. No. 08/675,559, filed Jul. 3, 1996, now U.S. Pat. No. 6,500,314.

FIELD OF THE INVENTION

The present invention relates to an improved plasma etch reactor apparatus and method.

BACKGROUND OF THE INVENTION

There are a number of prior art devices and methods used for plasma etching of semiconductor wafers. One successful such apparatus and method is disclosed and depicted in U.S. Pat. No. 4,464,223, for which a Reexamination Certificate was issued on Apr. 9, 1991. This plasma etch reactor depicts a reactor chamber which is bounded by three electrodes. An upper electrode is grounded, while a lower electrode is provided with a low frequency power supply along with a DC power supply. The lower electrode is also the chuck which holds the semiconductor wafer in position. Another electrode is located between the upper and lower electrodes and is positioned about the periphery of the reactor chamber in substantially cylindrical in shape. This electrode is provided with a high radio frequency power supply. In this arrangement, the high and low frequency power supplies are used to optimize (1) the disassociation of the process gases, and (2) the ion energy of the plasma generated reactant species.

While the above device has been very successful in operation, it has been found that more precise control of the plasma within the reactor chamber would be beneficial to the operation of a plasma etch reactor.

SUMMARY OF THE INVENTION

Accordingly, the present invention is directed to improving upon the operation of prior plasma etch reactors.

It is an object of the present invention to provide a plasma etch reactor which has an increased range of plasma density in order to affect and control the etching processes carried out in the reactor chamber. By way of example only, such enhanced plasma density range can favorably affect the selectivity and the profile control of the etching process.

It is a further object of the invention to provide a solid source which can be eroded to produce gaseous species that are advantageous to the etching process. It is also an object to controllably erode the solid source so that there is an appropriate mixture of the eroded gaseous species and injected process gases.

It is a further object of the invention to provide a unique nozzle arrangement which allows jets of process gas to reach the surface of a semiconductor wafer in order to create a uniform distribution of process gases at the surface.

It is yet a further object of the invention to provide a protruding insulator or baffle in order to further confine the reactor chamber and ensure that there is a uniform distribution of process gases and/or a uniform distribution of process gases mixed with the gaseous species from a solid source.

It is yet another object of the invention to provide an enhanced magnetic field in order to control the plasma created and the amount of gaseous species which are generated from the solid source.

It is a further object of the invention to define the dimensions of the reactor chamber in order to ensure that there is a uniform distribution of fresh process gases at the surface of the semiconductor wafer.

It is yet a further object of the present invention to provide one or more power sources association with one or more of the above features and objects in order to be able to select the desired plasma density within the enhanced range of possible plasma densities by adjusting the power provided to electrodes of the reactor chamber.

Finally, it is still another object of the present invention to provide a reactor chamber which has an increased range of plasma densities due to a combination of any one or all of the above objects and features.

Additional features, objects, and aspects of the invention are evident from the below description and the figures.

BRIEF DESCRIPTION OF THE FIGURES

FIGS. 4a, 4b, 4c, and 4d depict isometric, side cross-sectional, enlarged partial side cross-sectional, and end views of another preferred embodiment of a nozzle of the invention.

FIG. 7 depicts a perspective view of the arrangement of the magnets associated with a peripheral electrode of an embodiment of the invention.

DETAILED DESCRIPTION OF THE PREFERRED EMBODIMENT

Figure 1:
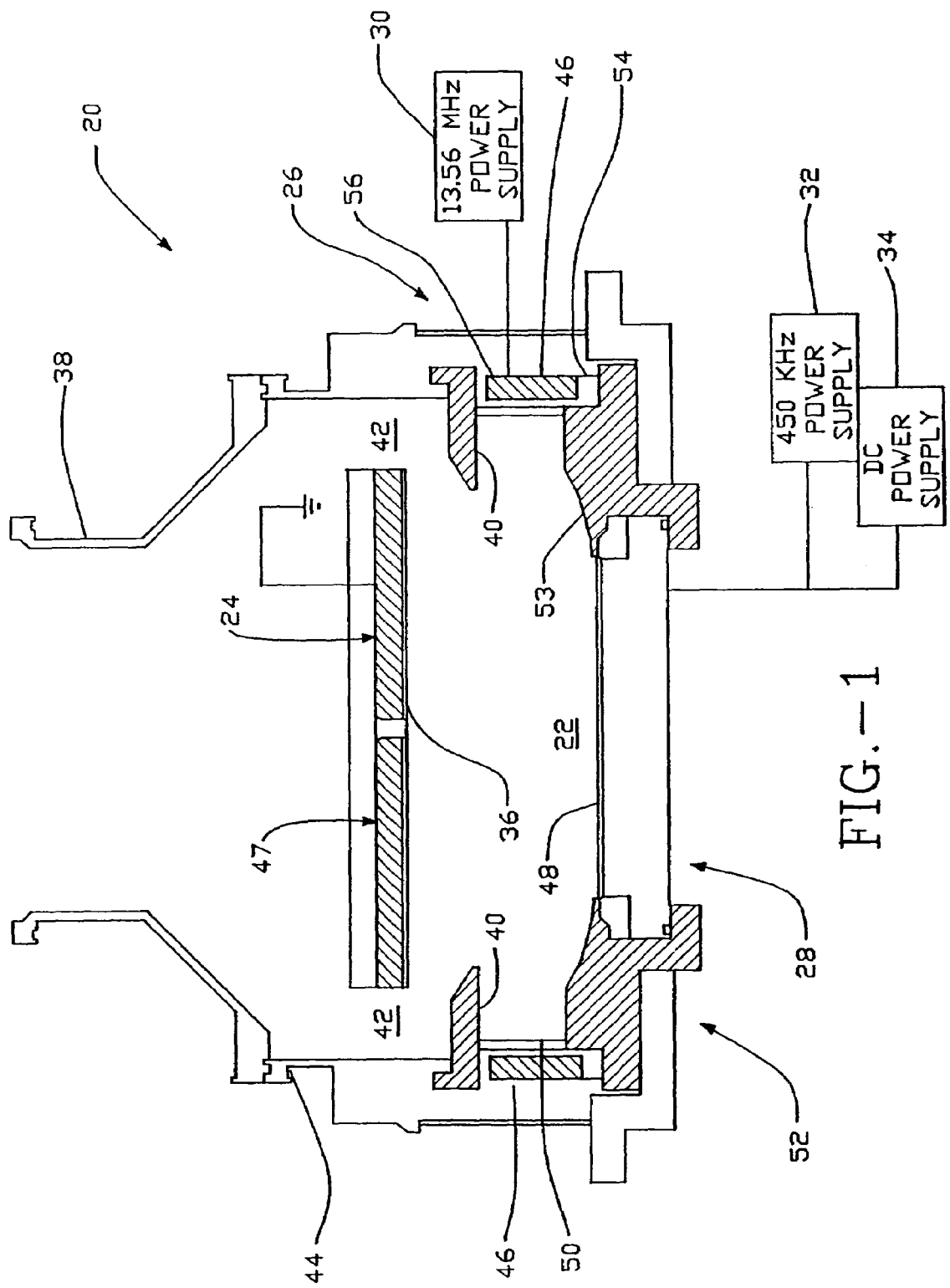
FIG. 1 is a side cross-sectional view of an embodiment of the plasma etch reactor of the invention.

Referring to the figures and in particular to FIG. 1, a side cross-sectional view of an embodiment of the plasma etch reactor 20 of the invention is depicted. This reactor 20 enhances and improves upon the reactor depicted and described in U.S. Pat. No. 4,464,223, which patent is incorporated herein by reference.

Reactor 20 includes a reactor chamber 22 which is bounded by a grounded upward electrode 24, a side peripheral electrode 26, and a bottom electrode 28. In a preferred embodiment, the side peripheral electrode 26 is connected to a power supply 30 which provides power to the side peripheral electrode 26 preferably at 13.56 MHz at a power level of preferably 1,100 watts. It is to be understood that this is a high frequency power supply (preferably in the radio frequency range) and that the frequency preferably can range from 2 MHz to 950 MHz. The power can also preferably be supplied in the range of 200 watts to 3,000 watts with a voltage of between 100 volts to 5,000 volts.

A second power supply 32 is connected to the bottom electrode 28. The second power supply 32 is preferably operated at 450 KHz with the power being preferably supplied at 30 watts, and at a voltage of 200 volts. This is the low frequency power supply. It is to be understood that this power supply (preferably in the radio frequency range) can be operated in the range of 10 KHz to 1 MHz with a power range of 2 watts to 1,000 watts, and a voltage range of 5 volts to 3,000 volts. Also connected to the bottom electrode 28 is a DC power supply 34. The high-frequency power applied to the side electrode 26 controls ion flux, while low-frequency power applied to the bottom electrode 28 independently controls ion energy.

It is the control of the power supplies and principally the high frequency power supply which advantageously controls the density of etch plasma in order to provide superior etch characteristics. Further, it is the design of reactor 20 which provides the enhanced plasma density range from which the optimal plasma density can be selected by the control of the power supply.

Associated with the grounded upward electrode 24 is a central nozzle 36 which directs a jet of process gas into the reactor chamber 22 directed at the semiconductor wafer 48. As will be discussed below in greater detail, the jets of process gas from the nozzle 36 are able to effectively reach the surface of the semiconductor wafer 48 and provide a fresh, uniform distribution of process gas over the entire surface of the semiconductor wafer 48.

Immediately above the grounded upper electrode 24 and the nozzle 36 is an exhaust stack 38, which is used to exhaust spent gas species from the reactor chamber 22. It is to be understood that a pump (not shown) is secured to the exhaust stack 38 in order to evacuate the gas species from the reactor chamber 22.

As can be seen in FIG. 1, immediately below the upper electrode 24 and nozzle 36 is a protruding, peripheral baffle 40. Baffle 40 is comprised of insulating material, and as will be discussed below, protrudes into the exhaust path 42 between the nozzle 36 and the housing 44 of the plasma etch reactor 20. Protruding baffle 40 ensures that there is a good mixture of the various gas species from the nozzle 36 and the solid source 50 in the reactor chamber 22.

Immediately below the protruding baffle 40 and in this embodiment incorporated into the side peripheral electrode 26 is a magnet or plurality of magnets 46. Also preferably incorporated in upper electrode 24 is a magnet or plurality of magnets 47. As will be discussed below, either one or both of these magnets 46 and 47 define a magnetic confinement chamber about and coincident with the reactor chamber 22. This magnetic confinement chamber ensure that the charged ion species in the reactor chamber do not leak therefrom, and that the charge ion species are concentrated about the semiconductor wafer 48. This magnetic confinement chamber inhibits the charged ion species from collecting on the walls of the reactor chamber 22.

Covering the side peripheral electrode 26 and the magnets 46 is a side peripheral solid source 50. This solid source 50 provides for an innovative source of a gaseous species which can be sputtered through the bombardment of, for example, radio frequency excited ions which knock or erode atoms of the gas species from the solid source 50 into the reaction chamber 22. The erosion of gaseous species from the surface of the solid source can be affected by pulsing one or both of the above AC power supplies. As a further advantage, as portions of the surfaces of the solid source erode, no particles can be formed on the eroding surface by the combination of gaseous species. Thus, contamination from such particles formed on eroding portions of the solid surface are eliminated. Variations of the solid source 50 are discussed hereinbelow.

Immediately below the solid source 50 is the wafer chuck 52 which positions the semiconductor wafer 48 relative to the reactor chamber 22. Wafer clamp 53 holds the wafer 48 on the wafer chuck 52. In this embodiment, the wafer chuck 52 as well as the bottom electrode 28 can be moved vertically downward in order to insert and remove the wafer 48.

In this embodiment, if desired, the side peripheral electrode 26 and the magnets 46 can be cooled using a cooling water manifold 54. It is further to be understood that the solid source 50 can be heated if desired using a hot water manifold 56. Other methods of heating the solid source 50, and particularly the front exposed surface thereof, include resistive and inductive heating, and radiant heat provided by lamps and other sources of photons.

The protruding baffle 40 as well as the configuration of the magnets and the process gas jets from the nozzle, and the gas species eroded from the solid source, provide for a high density plasma adjacent to the surface of the semiconductor wafer. This configuration greatly increases the range of densities that can be achieved within the reactor chamber 22. The exact density required can be selected from the greater range of densities by controlling the power provided to the peripheral electrode 26 by the power source 30. The power source can be turned down if there is a desire to reduce the erosion rate of gas species from the solid source, and to reduce the density of the plasma. Alternatively, the power source may be turned up in order to increase the density of the plasma in the reactor chamber 22.

By way of example only, if a polysilicon layer is being etched, the power provided by high frequency power source 30 would be turned down as a less dense plasma and a lower erosion rate is required from the solid source 50. Alternatively, if a silicide is being etched, the power would be turned up as a denser plasma and high erosion rate would be desired from the solid source. Further, the lower frequency power source can also be adjusted to affect the results of the etching process in the above invention.

The above range of operation is not possible with prior devices. It is to be understood that one or more of the above features can be used to enlarge the plasma density range and thus improve the etch process and fall within the spirit and scope of the invention.

Figure 2:
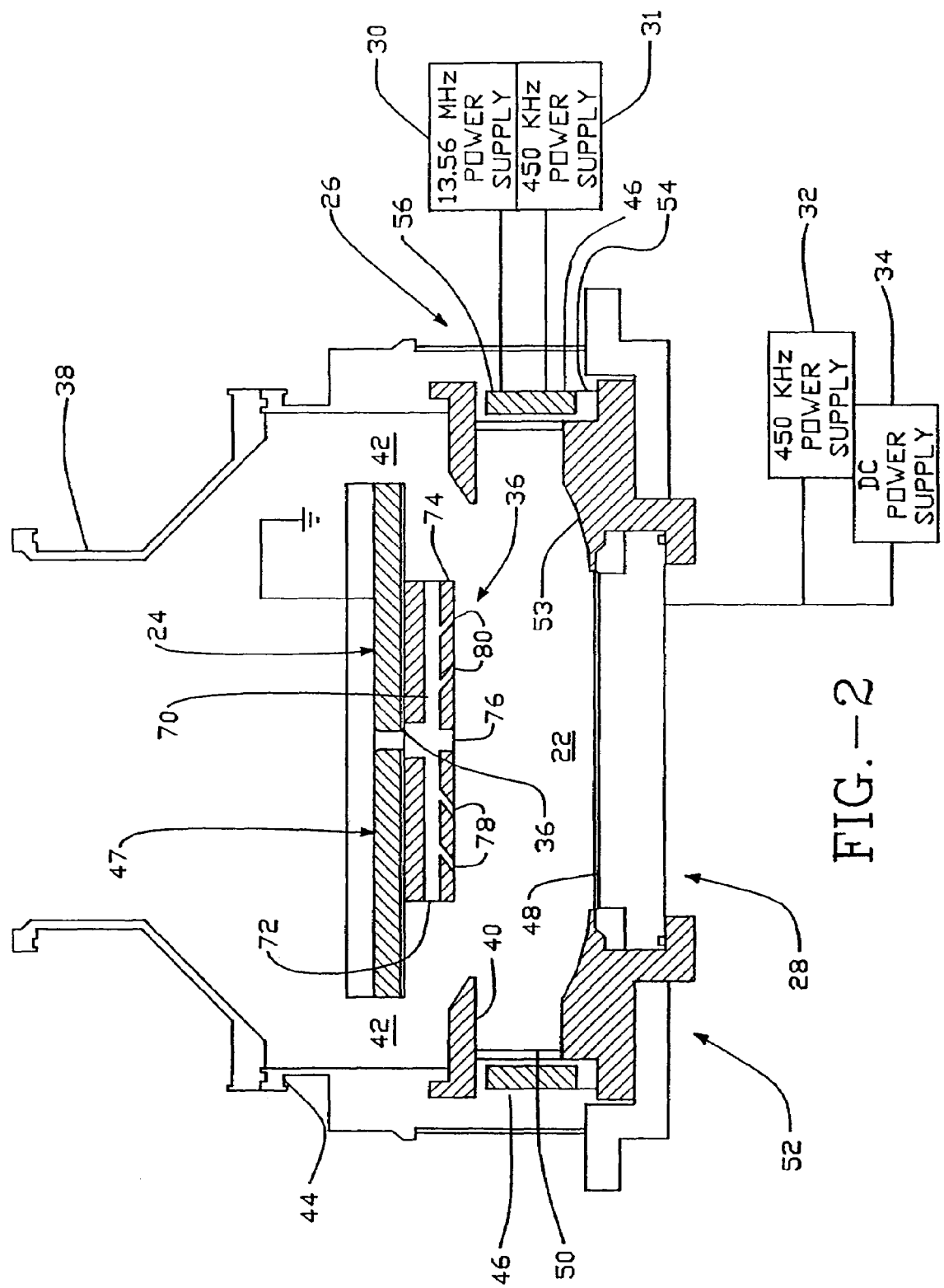
FIG. 2 is a view similar to FIG. 1 with the addition of an enhanced process gas inlet nozzle.

An alternative embodiment of the reactor 20 is shown in FIG. 2. Similar components are numbered with similar numbers as discussed hereinabove. In FIG. 2, the nozzle 36 has been modified in order to improve the uniformity of the mixture of the gaseous species in reactor chamber 22. As can be seen in FIG. 2, the nozzle 36 includes a manifold 70 which can channel the process gases in a number of directions. From manifold 70 there are horizontal ports 72, 74 which direct jets of the process gases horizontally and parallel to the upper electrode 24. Port 76 directs jets of the gas vertically downward directly onto the wafer 48. Ports 78 and 80 channel jets of the process gases in a direction skewed to the horizontal, and principally toward the periphery of the wafer 48 in order to assure a uniform distribution of process gases and/or a good mixture of the gas species sputtered or otherwise eroded from the solid source 50 and the jets of process gases. In this embodiment, it is also the combination of the ports of the manifold 70 and the protruding baffle 40 which ensures that a good mixture of (1) the gas species sputtered or eroded from the solid source 50, and (2) the process gases from the ports of the nozzle 36, are presented to the surface of the semiconductor wafer 48.

In this alternative embodiment, if desired, a second low frequency power supply 31 can be communicated with the peripheral electrode 26. This power supply would preferably have a frequency of 450 KHz. This power supply would be in all aspects similar to power supply 32. The high frequency power supply 30 would control the plasma density while the low frequency power supply 31 would control the erosion rate of gaseous species from the solid source. This would be an alternative to having the high frequency power supply control both the density of the plasma and the rate of erosion in the solid source.

Etching in prior art devices is usually performed in the 300 to 500 millitorr range, which range is one to two orders of magnitude higher than the low pressures contemplated by the reactor of the present invention. For etching of submicron features required by state-of-the-art semiconductor devices, low pressure operations are desirable. However, at low pressures, it is more difficult to maintain a high density plasma.

For the embodiments of FIGS. 1 and 2, the present invention contemplates a magnetic field which contains the plasma at a low pressure (3-5 millitorrs), with a high plasma density (1011 cm3 at the wafer), and with low ion energy (less than 15 to 30 electron volts). Generally, low pressure operation would be at about 150 millitorr or about 100 millitorr or less and preferably about 20 millitorr or about 10 millitorr or less. For submicron (sub 0.5 microns) devices, the plasma source must operate at a low pressure with a high density of activated gases at the wafer and a low ion energy in order to deliver superior etching results. A low pressure plasma improves the overall quality of the etch by minimizing the undercutting of the wafer features as well as the effect of microloading (etching concentrated features more rapidly than less concentrated features), both of which can adversely affect overall yield. Low pressure, however, requires a high density plasma at the wafer to increase the number of plasma particles reacting with a film on the semiconductor wafer being etched in order to maintain a fast etch rate. A fast etch rate is one factor leading to a higher average throughput. Further, low ion energy leads to improved etch selectivity and minimizes wafer damage. Both of which improve overall yield. It is contemplated that the present embodiments can operate at about 150 millitorr or less.

The reactor 20 of the present invention can be used to etch a variety of different substrates or films which require different etch chemistry or recipe. Generally, this chemistry includes two or more of the following gases: halogen gases, halogen containing gases, noble gases, and diatomic gases.

Variations of the above features describe above will now be explained in greater detail.

Solid Source:

It has been determined that the gaseous species eroded or sputtered from the solid source 50 or the lack of species eroded or sputtered therefrom can have a profound effect on the success of the etching process carried out in the plasma etch reactor 20. By way of example only, the solid source 50 can be comprised of a dielectric material such as for example silicon dioxide (SiO2) or quartz which upon bombardment by radio frequency excited ions provide gaseous ions of silicon and oxygen from the solid source into the reaction chamber. Another type of dielectric solid source can include a ceramic such as alumina (AL2O3). This ceramic has a low sputtering or erosion rate when impacted by excited gaseous ions and is useful for situations where no additional contribution from a solid source is required or desired. Particularly, with respect to alumina, with a power supply under approximately 600 volts peak to peak, little or no sputtering is observed. Over that threshold, there is sputtering from an alumina solid source.

Generally, the solid source can be comprised of a semiconductor material, a dielectric material, or a conductor. In fact, the solid source could be embodied in the materials which comprise the electrode, and those materials can be eroded to provide appropriate gas species for the plasma in the reactor chamber. Appropriate dielectric materials also include silicon nitride (Si3N4), in addition to other metal oxides besides alumina (Al2O3). Semiconductor materials can include silicon carbide (SiC). Further, conductors can include graphites and aluminum.

The surface temperature of the solid source 50 is preferably above 80° C. in order to provide for adequate sputtering. At this temperature and with the appropriate energized ions eroding the surface of these solid source, the solid source does not become a cold sink for the formation of particles, as discussed herein, from gaseous species, which particles can break away and contaminate the reaction chamber 22. As discussed above, the rate of erosion or sputtering of the gaseous species from the solid source 50 can be controlled by the high frequency power supply 30. By increasing the power supply 30, higher energy ions can be used to bombard the solid source 50 in order to increase the rate of erosion of gaseous species from the solid source for purposes of the etching process. By way of example, should a solid source of silicon dioxide be used, increased bombardment would enhance anisotropic etching as the gaseous species sputter from the silicon dioxide would passivate vertical surfaces on the semiconductor wafer so that such surface would not be undercut by the gaseous etchant species.

Further erosion of gaseous species from the solid source 50 can be used to provide selectivity in an over-etch situation. During etching, the etchant gases are used to selectively etch away, for example, polysilicon which has been deposited on an oxide layer. Photoresist protects the polysilicon which is not to be etched, while exposing the polysilicon which is to be etched away. After etching away the polysilicon, the underlying oxide layer is left. In some situations, small deposits of polysilicon remain in unwanted areas on top of the oxide substrate. Over-etching can be used to remove this unwanted polysilicon. However, over-etching can also undesirably etch into and remove the oxide layer. Through the use of the solid source, gas species therefrom can be used to ensure that the oxide substrate is not etched, while the remaining residual deposits of polysilicon are etched away. In this process, the species from the silicon dioxide source are deposited on both on the oxide substrate and on the residual polysilicon. However, the removal or etching rate of the polysilicon is higher than the deposit rate of the species from the solid source onto the polysilicon and thus the residual polysilicon is etched away without damage to the oxide substrate.

During the above over-etch process, the plasma power supply 30 is turned down and the DC bias 34 is lowered. By way of example only, the power supply 30 is turned down to one watt and the DC power supply is turned off. The activation energy curve for an oxide versus a polysilicon is such that as the energy is reduced, the polysilicon continues to be etched but at a slower rate while the etching of the oxide is reduced to near zero.

In another example, a semiconductor wafer includes tungsten silicide (WSi2) which have been deposited on a polysilicon layer, which polysilicon layer has been deposited on an oxide substrate. An appropriate photoresist layer is placed on the wafer and the wafer is exposed to process gases in the etchant chamber 22. A first reaction gas etches away the tungsten silicide and sometimes leaves deposits of tungsten silicide, called stringers, especially in areas where the tungsten silicide and polysilicon have step features. It is in the base of such steps that such stringers of tungsten silicide can be left. By using a solid source 50 as described above, the selectivity of the etch process can be controlled to preserve the underlying layers of polysilicon and oxide so that the physical dimensions and electrical performance of the semiconductor device does not change in any undesirable manner. Thus, using this method and controlling the selectivity, there is little or no attack of the underlying surface. It is found that with the above arrangement, that the selectivity for the removal of tungsten silicide to polysilicon is approximately 4 to 1. In other words, the tungsten silicide is removed at a rate of approximately four times greater than that of the polysilicon. Without such an arrangement, it is found that the selectivity is approximately 0.7 to 1, meaning that the tungsten silicide is etched at approximately 0.7 times the rate of etching of the polysilicon. Similar results are obtained for other types of metal silicides such as for example titanium silicides, cobalt silicides, and molybdenum silicides. It is these types of metal silicides that are used for fabricating MOSFETs, LEDs, and flat panel displays.

Gaseous Source:

In addition to the above benefits described with respect to the gaseous species eroded from the solid source, such benefits can also be acquired by introducing in the process gases, gases which have the effect derived from the gaseous species eroded from the surface of the solid source. By way of example only, a gaseous form of tetraethoxysilane (TEOS) can be introduced with the process gas. TEOS is a source of silicon and oxygen for the etching process. TEOS in the process chamber provides the same gaseous species as does a solid source of silicon dioxide (SiO2) with the advantages to the etching process described herein. Also it is to be noted that a combination of both solid source and a gaseous source of such species would be within the spirit and scope of the invention.

Nozzles:

FIGS. 3a, 3b, 4a, 4b, 4c, 4d, 5a, 5b, 5c, 6a, 6b, and 6c depict alternative preferred embodiments of nozzle arrangements which can be used with the above invention. Conventional nozzle arrangements are generally configured in a "shower head" configuration with as many as 200 ports from which process gases to be ejected. The intent of such an arrangement was to ensure that there was a uniform distribution of the process gases in the chamber, and in particular, at the surface of the semiconductor wafer that was being processed. Prior art devices have been found to create a layer of stagnate, used gases which have already reacted with the wafer surface and thus dilute the uniformity of new process gases directed toward the surface. The present invention improves upon such prior art nozzles. The present invention includes nozzles which generate discrete collimated jets of process gases which merged together adjacent the wafer surface to create a uniform distribution at the surface of the wafer. The velocity of the gases and the volume in the jets assure that fresh process gas reaches the surface of the semiconductor wafer. Thus, fresh process gases are uniformally distributed at the surface of the semiconductor wafer. These process gas jets stir up the gases at the surface of the wafer making a uniform distribution of process gas and gaseous species eroded from the surface of the solid source.

Figure 3A:
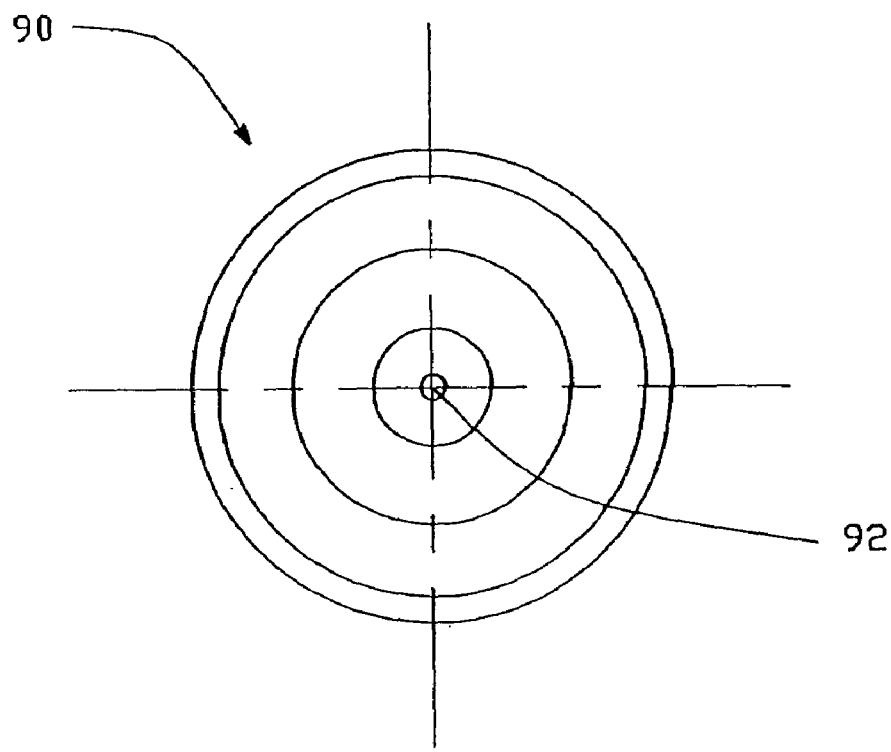
FIGS. 3a and 3b depict end and side cross-sectional views of a preferred embodiment of a nozzle of the invention.
Figure 3B:
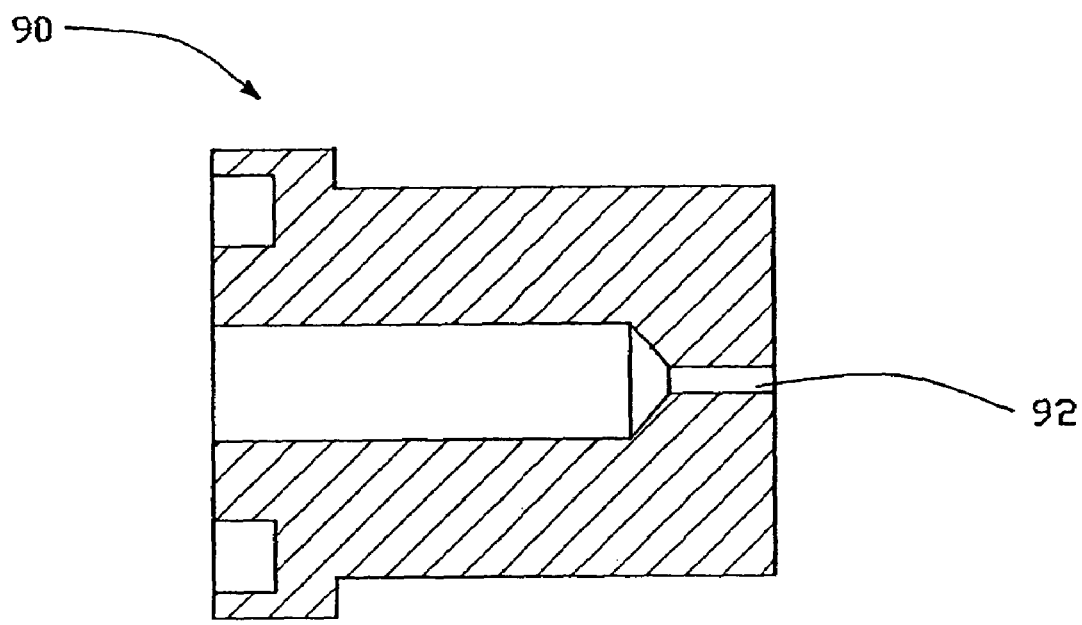

FIGS. 3a and 3b depict a one-port nozzle 90 with the port identified as 92. The nozzle is preferably comprised of alumina. With this arrangement, a single jet of gas is projected toward the semiconductor wafer.

Figure 4C:
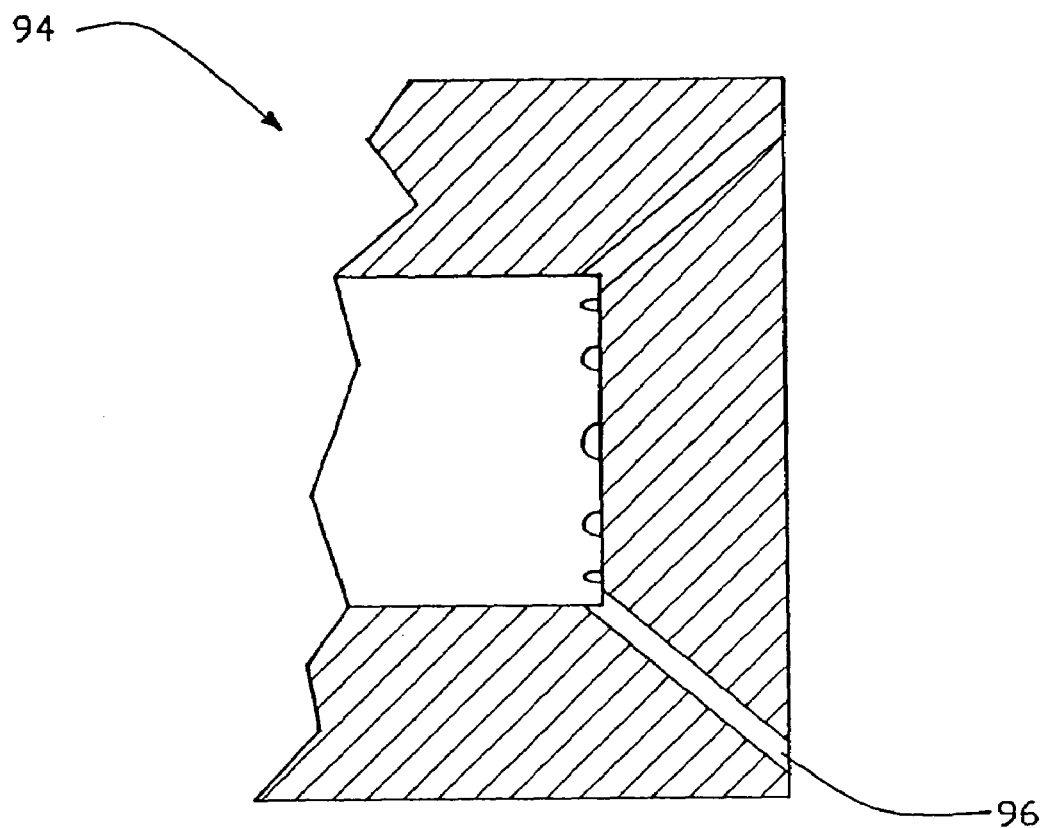
Figure 4D:
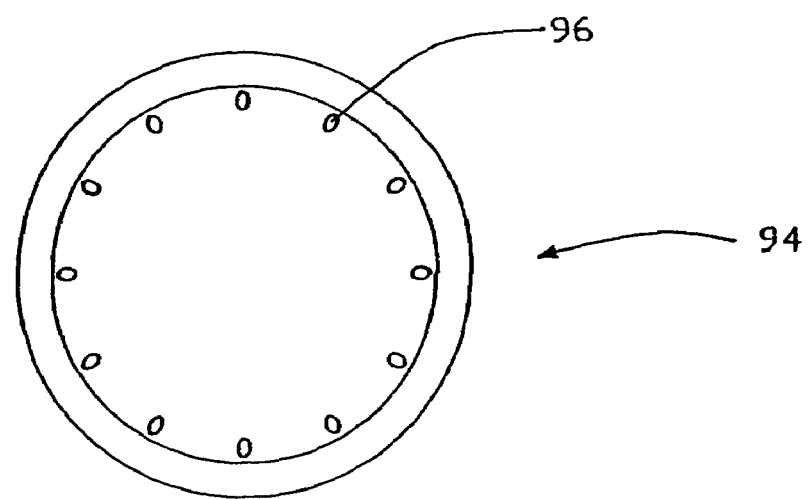

FIGS. 4a, 4b, 4c, and 4d depict another preferred embodiment of a nozzle 94 of the invention which is also comprised of alumina. In this embodiment, the nozzle 94 includes twelve ports which define jets of process gas that are directed toward the semiconductor wafer. Preferably, the jets are directed at an angle which is skew to vertical and the centerline of each jet is directed toward the peripheral edge of the wafer. This arrangement is again beneficial in ensuring that there is a uniform distribution of new process gases at the surface of the wafer. As can be seen in FIG. 4d, the ports are distributed around the periphery of the face of the nozzle.

Figure 5A:
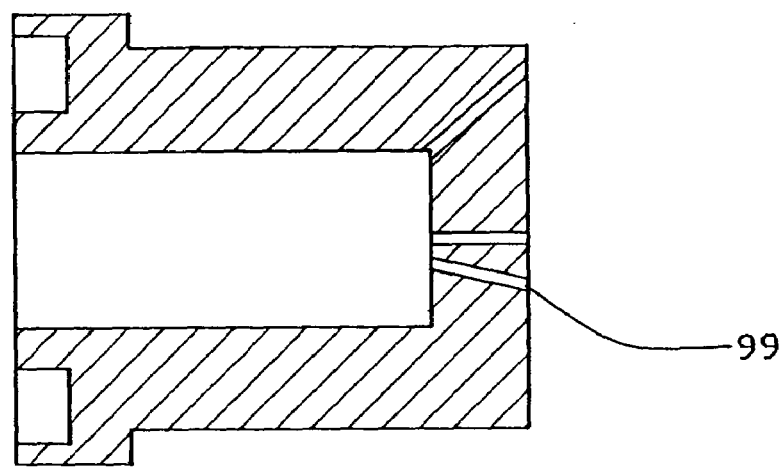
FIGS. 5a, 5b, and 5c depict side cross-sectional, enlarged partial cross-sectional, and end views of yet another preferred embodiment of a nozzle of the invention.
Figure 5B:
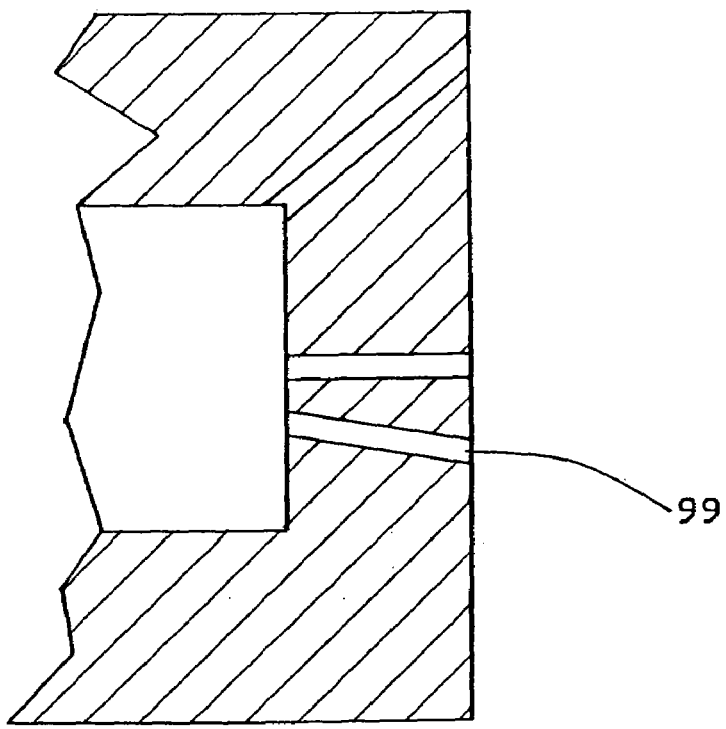
Figure 5C:
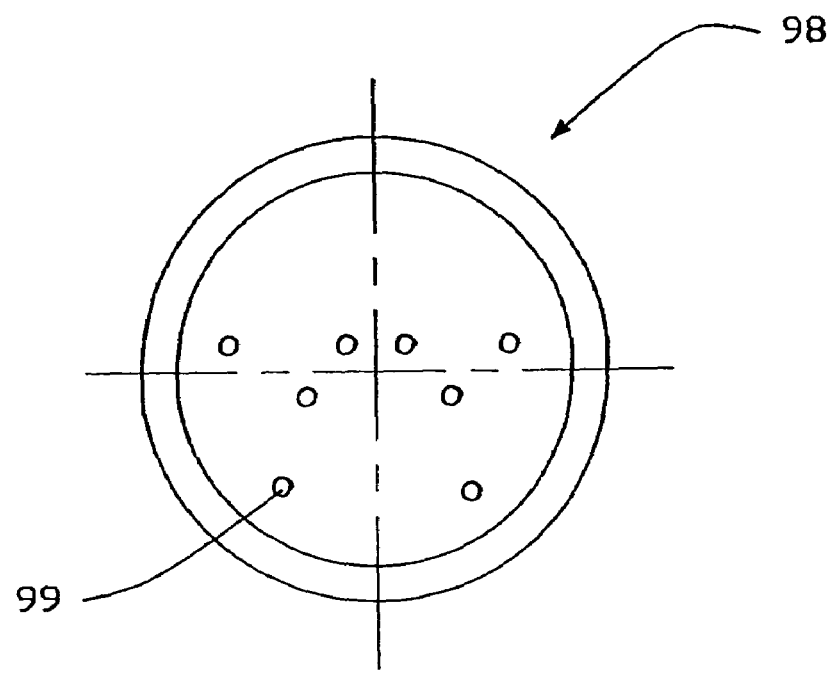

FIGS. 5a, 5b, and 5c depict a further embodiment of a nozzle 98 of the invention. In this arrangement, the ports 99 are depicted in a star formation with some of the ports being provided on the periphery of the face (FIG. 5c) of the nozzle 98 while other of the ports are centrally located with one port on the centerline of the nozzle. As with the gases from the nozzle of FIG. 4a, the jets of the nozzle of FIG. 5a are angled with respect to the vertical and thus are directed both at the body of the semiconductor wafer and at the edge of the semiconductor wafer in order to provide a uniform distribution of process gas.

Figure 6A:
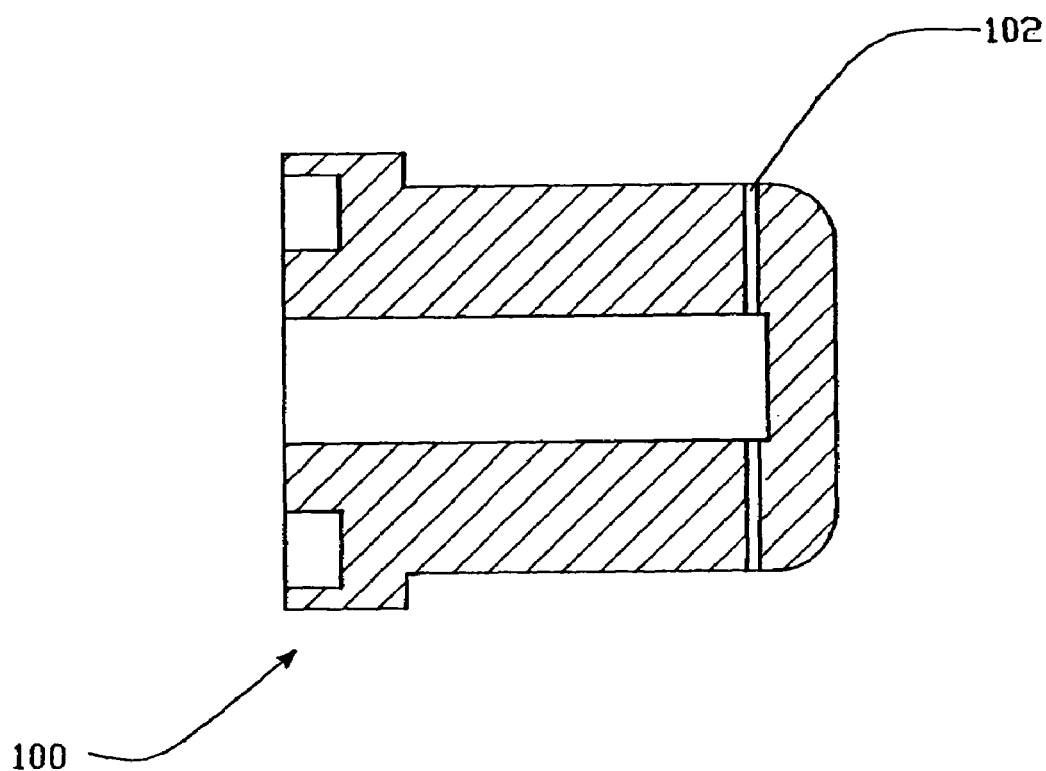
FIGS. 6a, 6b, and 6c depict side cross-sectional, enlarged partial cross-sectional, and end views of still a further embodiment of a nozzle of the invention.
Figure 6B:
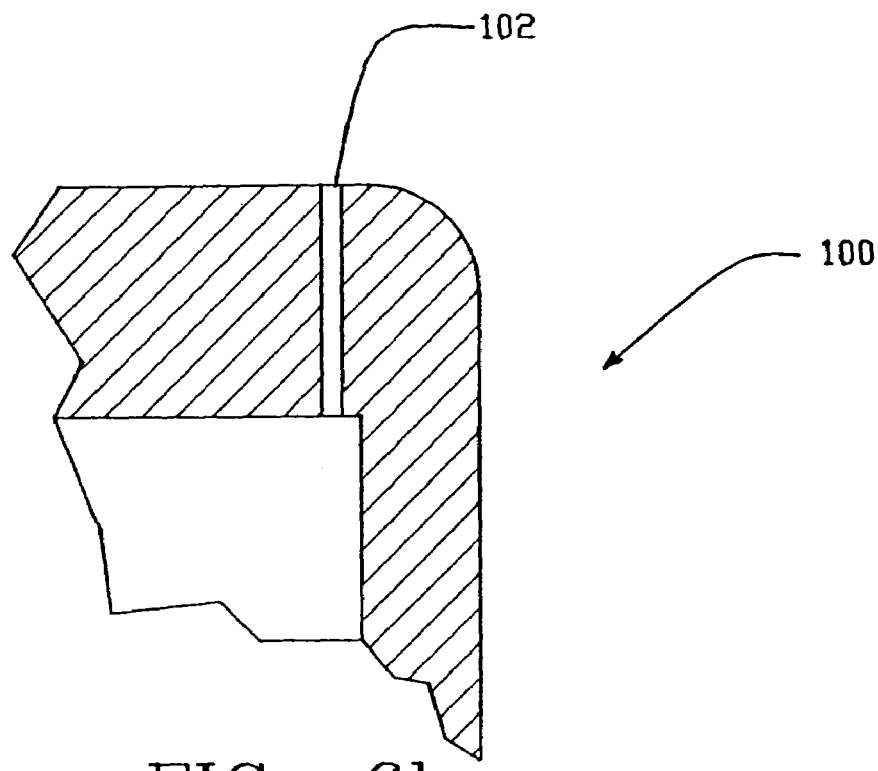
Figure 6C:
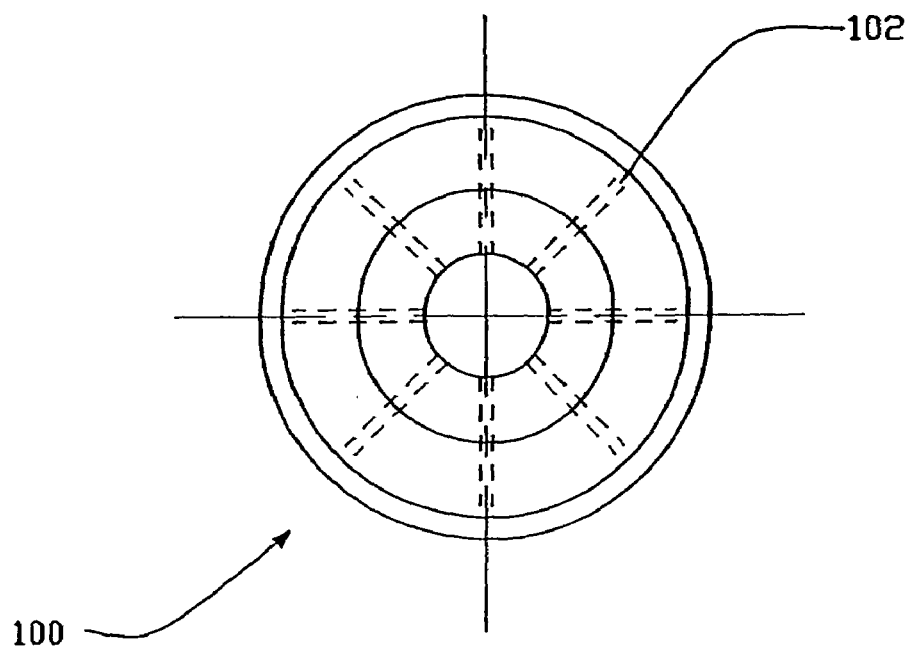

FIGS. 6a, 6b, and 6c depict yet another preferred embodiment of the nozzle 100 of the invention. In this embodiment, ports 102 are directed essentially normal to a vertical line between the nozzle and the semiconductor wafer. In this embodiment, the nozzles are directed toward the solid source on the side wall in order to ensure greater mixing of the gas species from the solid source and the process gas.

Magnetic Confinement:

The above identified magnets 46, 47 provide a magnetic confinement around reactor chamber 22 which ensures that a high density plasma can be formed at low pressure. It is to be remembered that the plasma is created through a collision of gas atoms and electrons, generating ions to create a high density plasma at low pressure. The present invention achieves this by increasing the total path length of the electrons traveling through the plasma while minimizing ion loss to the reactor wall. The electrons traveling toward the plasma are reflected by the magnetic field back into the plasma thus increasing the path length of the electrons.

With the present invention, the magnets can either be electromagnets or permanent magnets and be within the spirit and scope of the invention. These magnets, surrounding the etch chamber, create a magnetic field container. The magnetic field effect exists only near the reactor walls, is virtually non-existent at the wafer, and creates an inherently uniform plasma. The magnets can provide the function of protecting the electrodes as with a stronger magnetic confinement, there is less erosion on the electrodes. A weaker confinement provides for more erosion of the electrode and the solid source.

The magnetic confinement caused by the magnets 46, 47, thus is designed to concentrate the plasma and can have the effect of protecting the process chamber parts, including the electrodes from the corrosive plasma. As a result, there can be considerable cost savings, as the cost for replacing the electrodes is reduced.

Figure 8:
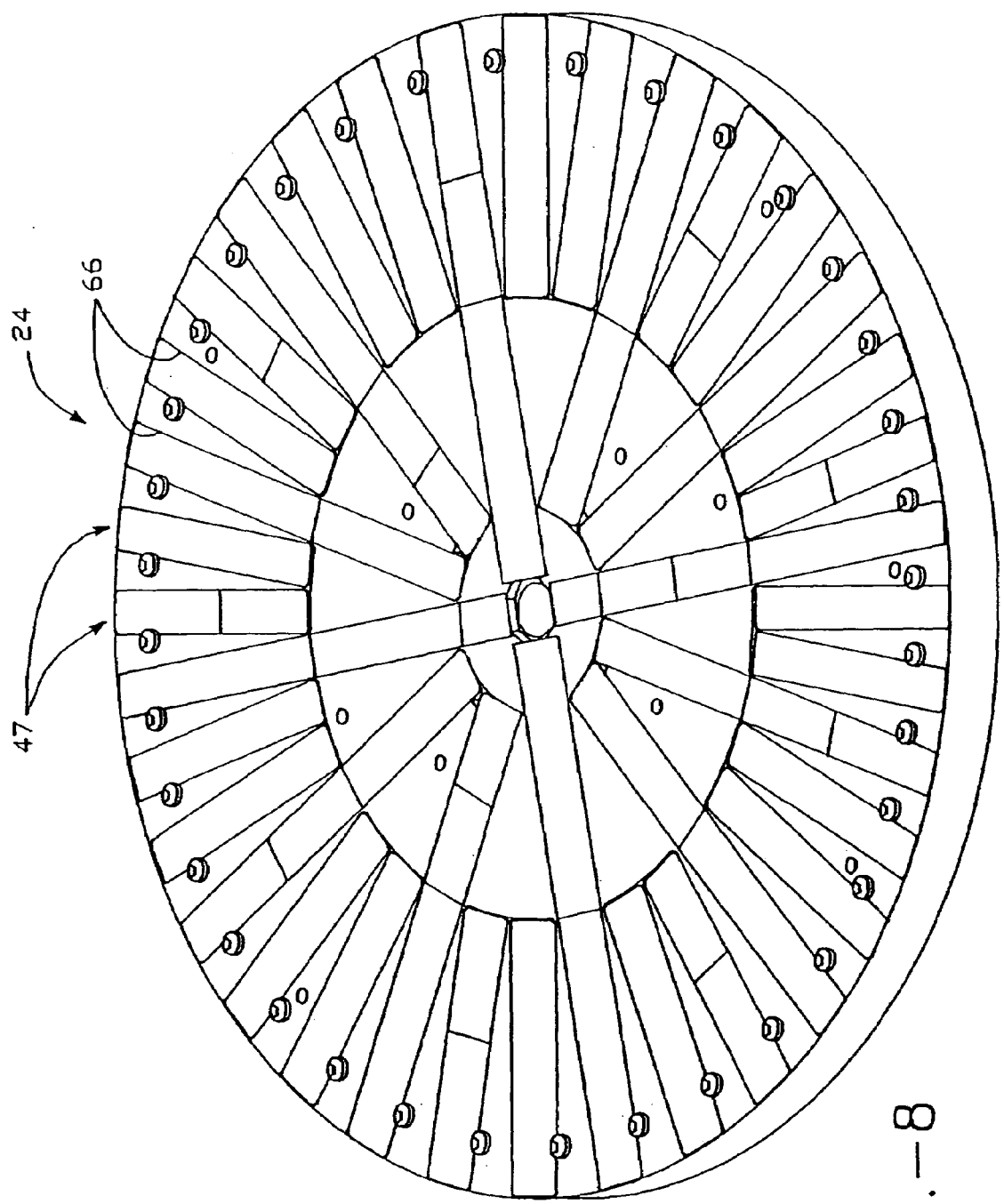
FIG. 8 depicts a perspective view of the arrangement of the magnets associated with the upper electrode of an embodiment of the invention.

FIGS. 7 and 8 depict an arrangement of the magnet 46, 47, in association with the side electrode 26 and the upper electrode 24 respectively. As can be seen in FIG. 7 there are a plurality of slots 60 found relative to the electrode 26. In a preferred embodiment, all of the slots are filled with the magnet 46. For this particular embodiment, it is specified that there are thirty-six ceramic magnets in electrode 26. These magnets each have a strength of about 300 Gauss to about 600 Gauss at the surface of the pole face. These magnets located behind the solid source 50 affect the rate of erosion of gas species from the solid source. As indicated above, without the magnets, it is possible that too many gaseous species can be eroded from the solid surface and thus affect the etch process.

It is to be noted that these magnets are pole face magnets. The north and south poles are on the faces 62 and the opposing faces 64 of the magnets. The magnets are arranged alternatively so that first a north pole face of one magnet 46 and then a south pole face of a second magnet 46 are directed toward the center of the chamber. This is repeated about the outer periphery of the electrode 26.

FIG. 8 depicts the arrangement of the magnets 47 associated with the upper electrode 24. In FIG. 8, all of the slot 66 are filled with magnets similar to magnets 46. As in this particular embodiment, there would be 36 magnets spoked out from the center of the electrode 24 so that 36 magnet ends appear at the peripheral edge of the electrode 24. Again, these magnets are pole faced magnets, with the north and south poles projecting from the side faces of the magnets. For the configuration of FIG. 8, the magnets alternate with the north and then the south poles facing towards the chamber.

It is to be understood that the above magnets can be replaced with stronger magnets such as rare earth magnets. In such situations, the number of magnets required would reduce in order to obtain comparable magnetic confinements. The rare earth magnets could have a strength of about 1,500 Gauss to about 2,500 Gauss at the surface of the pole face of the magnet. Preferably, the magnets would have the strength of about 2,000 Gauss to about 2,200 Gauss at the surface of the magnet pole face.

Reactor Chamber:

The reactor chamber in the present invention has been specifically designed, as discussed above and below, in order to enhance the uniformity of the plasma. With respect to the physical characteristics of the reactor chamber 22, as noted above, both the placement of the baffle 40 and the nozzle 36, 70 contribute to the uniformity of the process gases in the reactor chamber 22. The baffle 40 ensures that the gas species eroded from the surface of the solid source 50 are not immediately drawn up by the pump through the exhaust shaft 38, but are allowed to mix with the gases in the reactor chamber adjacent to the semiconductor wafer 48. Additionally, the nozzle 38 having ports which channel jets of gases vertically, horizontally, and at skewed angles ensure that any gas species from the solid source are thoroughly mixed with the process gases from the nozzle and that this uniform mixture is provided to the semiconductor wafer 48.

The height of the reactor chamber from the nozzle to the surface of the semiconductor wafer can be optimized. Prior art devices have a height of 5¼". It has been found that with the above described height and also the nozzle arrangements can be optimized in order to have the gas jets from the nozzle provide a uniform distribution of process gas at the surface of the semiconductor wafer. Thus, also for varying reactor heights, nozzle pattern compared to chamber pressure can be optimized for the etch process including the etch process using a solid source. This height is irrespective of the diameter of the reactor chamber, although in a preferred embodiment, the reactor chamber is approximately 14½" in diameter. By way of example only, for preferred operation at two to three millitorr of pressure in the reactor chamber 22, the height of the reactor chamber would be preferably about 4". For a height of less than 4", the jets would still be collimated and thus not uniformly spread at the surface of the wafer. For a height greater than 4", the jets could merge together above the surface of the semiconductor wafer so as not to provide a uniform distribution of process gases at the surface of the wafer.

Optimally, for a given nozzle configuration, it has been found that the product of the height of the reactor chamber 22 with the pressure in the chamber, should be constant in order to provide for optimal performance. Thus, as indicated above, optimal performance can be achieved with a height of 4" and a pressure of two to three millitorr. The range of values for pressure and height include a height range of ⅟₁₀ of an inch corresponding to 100 millitorr to a height of 10" corresponding to one millitorr for optimal performance. That is to say that as the pressure increases in the reactor chamber, that the height of the reactor chamber can be less and that as the pressure decreases, the height would increase in order to provide for optimal mixing of (1) the gases eroded from the solid source, (2) injected process gases, and (3) reaction products from the wafer surface.

The effect of the above invention is to (1) increase the selectivity (i.e., for example protect the oxide substrate), (2) enhance the profile control of the etch process, and (3) enhance the line width control (i.e., protecting the photoresist from the etching process so that the correct line width is transferred from the photoresist to the wafer).

INDUSTRIAL APPLICABILITY

It is seen that the present invention provides for an etching system which provides for (1) a controlled anisotropic profile (i.e., straight, vertical sidewalls), while (2) etching selectively to minimize damage to the underlayer substrate such as the oxide or other wafer materials, and while (3) etching uniformally over a non-uniform area in order to remove stringers and other residual deposits. The present system provides for etching in the submicron range of less than 0.5 microns and preferably less than 0.25 microns.

Accordingly, the present invention meets the above objects by providing a greater range of plasma densities through the reactor chamber. This range of plasma densities is affected by the above referenced solid source of gaseous species, the reactor chamber configuration including the protruding baffle and reactor height, the nozzle configuration, and the configuration of the magnetic field. The density can then be controlled by adjusting the power supply to one or more of the electrodes.

Other features, aspects and objects of the invention can be obtained from a review of the figures and the claims.

It is to be understood that other embodiments of the invention can be developed and fall within the spirit and scope of the invention and claims.

We claim:

1. A method for anisotropically etching features on a wafer having vertical surfaces, comprising:

providing a reactor chamber with one of a ceramic and a metal oxide solid source of gaseous species;

applying power to an electrode associated with the solid source in order to control the rate of generation of the gaseous species from the solid source, said gaseous species comprising at least one of oxygen atoms and oxygen-containing ions; and allowing the gaseous species to passivate vertical surfaces on the wafer in order to enhance anisotropic etch.

2. The method of claim 1, wherein the material for the solid source comprises aluminum oxide ($Al_2O_3$).

3. The method of claim 1, further comprising:
controlling the level of power applied to the electrode in the reactor chamber.

4. The method of claim 1, further comprising:
controlling the frequency of power applied to the electrode in the reactor chamber.

5. The method of claim 1, further comprising:
using a first power supply at a first frequency and a second power supply at a second frequency to control the rate of generation of gaseous species from the solid source.

6. The method of claim 5, further comprising:
operating the first power supply in the range of about 2 MHz to about 950 MHz; and
operating the second power supply in the range of about 10 KHz to about 1 MHz.

7. The method of claim 1, further comprising:
controlling the temperature of the solid source in order to control the generation rate of gaseous species from the solid source.

8. The method of claim 1, further comprising:
pulsing the power applied to the electrode.

9. A method for anisotropically etching features on a wafer having vertical surfaces, comprising:
providing a reactor chamber with a ceramic solid source of gaseous species;
applying power to an electrode in association with the solid source in order to control the rate of generation of the gaseous species from the solid source, said gaseous species comprising one of aluminum ions and aluminum oxide ions; and
allowing the gaseous species to passivate vertical surfaces on the wafer in order to enhance anisotropic etch.

10. The method of claim 9, wherein the material for the solid source comprises aluminum oxide ($Al_2O_3$).

11. The method of claim 9, further comprising:
controlling the level of power applied to the electrode in the reactor chamber.

12. The method of claim 9, further comprising:
controlling the frequency of power applied to the electrode in the reactor chamber.

13. The method of claim 9, further comprising:
using a first power supply at a first frequency and a second power supply at a second frequency to control the rate of generation of gaseous species from the solid source.

14. The method of claim 13, further comprising:
operating the first power supply in the range of about 2 MHz to about 950 MHz; and
operating the second power supply in the range of about 10 KHz to about 1 MHz.

15. The method of claim 9, further comprising:
controlling the temperature of the solid source in order to control the generation rate of gaseous species from the solid source.

16. The method of claim 9, further comprising:
pulsing the power applied to the electrode.

17. A method for anisotropically etching features on a wafer having vertical surfaces, comprising:
providing a reactor chamber with a conductor solid source of gaseous species;
applying power to an electrode in association with the solid source in order to control the rate of generation of the gaseous species from the solid source, said gaseous species comprising one of aluminum ions and carbon ions; and
allowing the gaseous species to passivate vertical surfaces on the wafer in order to enhance anisotropic etch.

18. The method of claim 17, selecting, wherein the material for the solid source comprises aluminum, silicon carbide, or graphite.

19. The method of claim 17, further comprising:
using a first power supply at a first frequency and a second power supply at a second frequency to control the rate of erosion of gaseous species from the solid source.

20. The method of claim 17, further comprising:
pulsing the power applied to the electrode.

* * * * *